FIP8102 OR 3,146,398

SEARCH ROOM

Aug. 25, 1964 M. SCHNÄDELBACH 3,146,398

MULTI-STAGE FREQUENCY CONVERSION TRANSMITTER ADAPTED FOR TUNING WITHIN AN EXTENDED FREQUENCY RANGE

Filed June 3, 1960

3,146,398

MULTI-STAGE FREQUENCY CONVERSION TRANSMITTER ADAPTED FOR TUNING WITHIN AN EXTENDED FREQUENCY RANGE

Martin Schnädelbach, Munich, Germany, assignor to Siemens & Halske Aktiengesellschaft Berlin and Munich, a corporation of Germany Filed June 3, 1960, Ser. No. 33,836
Claims priority, application Germany June 16, 1959
2 Claims. (Cl. 325—134)

Figure 1:
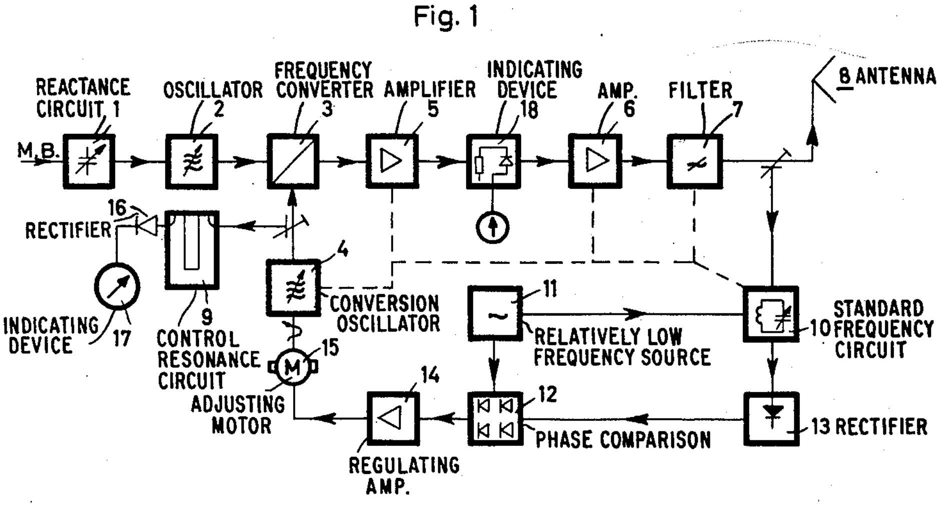

This invention is concerned with a multi-stage transmitter, especially for very short electromagnetic waves, operating with frequency conversion and adapted for tuning within an extended frequency range, comprising a common drive system for controlling the actuation of the tuning means in the individual stages.

In the case of multi-stage transmitters which are to be adapted for tuning within extended frequency ranges, the requirement is often posed, for reasons of simple operation, that the tuning shall be a single knob tuning, that is, all stages shall be simultaneously brought into the desired positions by means of a single adjusting device. This is usually effected by the provision, in the mechanical drive system, of stops and locks which are operable to assure that the respective members to be actuated are in the individual stages always in the same starting position. Auxiliary correction devices may be provided in the individual stages for equalizing or compensating given tolerances.

However, the tuning or adjustment occasions particular difficulties when it is required to exchange a structural group or a tube, because such exchange can falsify the characteristics of the corresponding stage to such extent that it becomes practically impossible to produce with the available correction members the correct coordinated drive, or tracking conditions. It is then in practice necessary to employ complicated measuring procedures for correctly retuning the apparatus, which is extremely cumbersome, above all in connection with portable apparatus for which a completely equipped measuring stand may not always be available. The problems involved become particularly awkward in the case of a transmitter operating with frequency conversion because the coordinated drive or tracking conditions are in such case much more difficult to restore.

The problem underlying the invention is to point a way for making it in connection with such apparatus possible to provide the required coordinated drive of the individual stages or structural groups, even in the absence of a measuring stand which would normally be necessary, in the event that such coordinated drive should have been lost, for example, due to exchange of structural groups or exchange of tubes.

This problem is according to the invention solved, in connection with apparatus of the initially indicated kind, by the provision, in the transmitter, of a control resonance circuit tuned to the operating frequency of the transmitter oscillator and equipped with an indicating device, and arranging such control resonance circuit so that it receives from the transmitter oscillator energy sufficient for an indication even in the presence of strong detuning of the individual stages. The tuning frequency of this control resonance circuit should, in a transmitter operating with frequency conversion, agree with an oscillator frequency at which at least a nearly coordinated drive is required between the tuning means for the individual stages.

Figure 2:
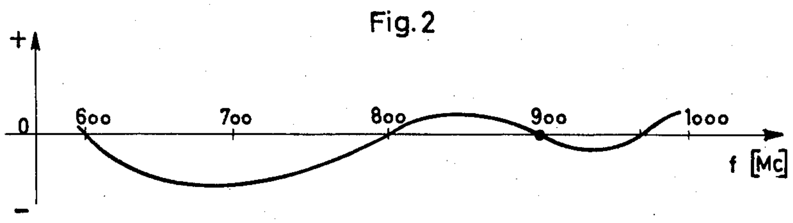

The various objects and features of the invention will appear from the description of an embodiment which is rendered below with reference to the accompanying drawing, wherein FIG. 1 shows a transmitter operating in accordance with the superimposition principle, for example, in a frequency range between 500 and 1000 megacycles; and FIG. 2 represents the course of the coordinated drive curve for the individual tuning means of the arrangement according to FIG. 1.

Referring now to the drawing, the message or intelligence to be transmitted, which is indicated in FIG. 1, as modulation band MB, is over a reactance circuit 1 modulated on an oscillator 2 operating, for example, with a fixed frequency of 100 megacycles. The frequency modulated output oscillation of this oscillator is by means of a frequency converter 3 converted to a higher selective output frequency, for example, 900 megacycles, which is done by means of a conversion oscillator 4, such oscillator being adapted for tuning within an extended frequency range. The conversion oscillator 4 may for this purpose operate, for example, on a frequency of 800 megacycles. The output frequency of the frequency converter 3 is thereupon amplified in two multi-stage amplifiers 5 and 6, and is conducted to the antenna 8 over a transmitter output filter 7.

In order to stabilize the transmitter oscillator 4 with respect to its frequency, there is provided a resonance circuit 10, constructed as a frequency standard, for example, a tank circuit, which is loosely coupled to the transmitter output. This circuit 10, serving as a frequency standard, is slightly wobbled in its tuning from a source 11 of low frequency, for example, 50 cycles. The same wobble frequency is conducted to a phase comparer 12 which also receives, over rectifier 13, the rectified output voltage from the standard circuit 10. The output voltage from the phase comparer 12 is in known manner a function of the transmitter output frequency modified by the tuning frequency of the standard circuit 10. This output voltage is over a regulation amplifier 14 conducted to a position-correction motor 15 which corrects the transmitter oscillator so as to bring about agreement between the transmitter output frequency and the tuning frequency of the standard circuit 10.

In order to employ single knob tuning in connection with such apparatus, it is necessary to provide the structural groups 4, 5, 6, 7 and 10 with a common drive system comprising mechanical locks and stops so as to assure that the respective tuning means in the individual stages are always in identical starting or initial positions.

Apparatus of the kind described with reference to FIG. 1 can operate in practice, with single knob tuning, only so long as there is certainty that the transmitter output frequency transmitting over the amplifiers 5 and 6 and the filter 7, is so close to the tuning frequency of the standard circuit 10, that the latter can effect the corrective regulation of the transmitter oscillator 4 as may be required. However, assuming, for example, that a tube is to be exchanged in one of the stages 5, 6 or in the conversion oscillator 4, or that one of these stages is to be exchanged, this requirement will not be met and it will be extremely difficult to place the individual stages, without a measuring stand, into such coordinated drive or tracking relation that the frequency regulation device can become operative under control of the standard circuit 10.

A surprisingly simple solution for this problem is however possible by the provision, as proposed by the invention, of a control resonance circuit for the oscillator frequency at a place at which such control resonance circuit will with certainty receive the energy of the transmitter oscillator 4. Suitable places of this kind are, for example, at the output of the transmitter oscillator 4 or at the output of the frequency converter 3.

In the illustrated embodiment, the control resonance circuit 9 is loosely capacitively coupled to the output of the transmitter oscillator 4. This control resonance circuit 9 which is in the illustrated embodiment a fixedly tuned coaxial line resonator, is fixedly tuned to one of the operating frequencies of the conversion oscillator 4. The control resonance circuit 9 supplies, for example, over a loop coupling and rectifier 16, an indicating device 17 which is operatively energized when the frequency of the conversion oscillator 4 is within the resonance curve of the control resonance circuit 9.

It is assumed, for example, in connection with the superimposition transmitter according to FIG. 1, that the coordinating drive curve of the individual tuning means has a course approximately as shown in FIG. 2, that is, that it has several naturally coordinated drive points where the curve is at zero. The tuning frequency of the control oscillation circiut 9 corresponds to one of such naturally coordinated drive points, namely, to the oscillator frequency of 800 megacycles required at the coordinated drive frequency of 900 megacycles. Accordingly, an indication is obtained for this oscillator frequency, at the indicating device of the control resonance circuit 9. In the event that all circuits should, for example, be mutually strongly detuned and that a coordinated drive cannot be produced by means of other correction devices that may be provided, this control oscillation circuit offers a simple possibility for restoring the satisfactory operation of the transmitter. It must be considered in this connection that the tuning of the oscillator 4 is altered until the output frequency thereof agrees with the tuning frequency of the control resonance circuit 9 when a maximum indication is obtained at the indicating device 17. An unambiguous reference point is thus obtained for the adjustment of the transmitter oscillator 4.

It is now merely necessary that the amplifiers 5, 6 and the filter 7 be correctively adjusted, by means of their correction devices or mechanically, so that maximum output energy appears at the output of the transmitter. As will be apparent, this is in the assumed example always the case when a coordinate drive point of the transmitter tuning lies at the output frequency of the transmitter which is determined by the control oscillation circuit 9.

For the simplification of the tuning of the illustrated apparatus, there is provided a further indicating device

18 between the amplifiers 5 and 6, which makes it possible, in the case of extreme detuning, to place the stage 5 in coordinated drive independent of the stages 6 and 7. A similar indicating device which may be coupled to the appropriate line by means of a directional coupler and a rectifier, may for similar reasons be provided in back of the amplifier 6, for example, at the output of the filter 7.

Changes may be made within the scope and spirit of the appended claims which define what is believed to be new and desired to have protected by Letters Patent.

I claim:

1. A multi-stage transmitter for very short electromagnetic waves operating with frequency conversion and having means for tuning within an extended frequency range, wherein the tuning means of the individual stages are actuated under control of a common drive system, comprising an indicating device cooperating with a control resonance cicruit which is fixedly tuned to a single predetermined operating frequency of the transmitter oscillator, and circuit means whereby said control resonance circuit is supplied from the transmitter oscillator, with sufficient energy for effecting indication even with strong detuning of the individual stages.

2. A transmitter according to claim 1, wherein the transmitter oscillator is provided with stabilizing means, and the tuning frequency of the control resonance circuit corresponds to an oscillator frequency at which the tuning means for the individual stages should be at least close to a natural coordinate drive condition with stabilization by said stabiliizng means.

References Cited in the file of this patent

UNITED STATES PATENTS

| | | |
|---|---|---|
| 2,474,354 | Guanella | June 28, 1949 |
| 2,539,673 | Peterson | Jan. 30, 1951 |
| 2,568,412 | Robinson | Sept. 18, 1951 |
| 2,668,232 | Tunick | Feb. 2, 1954 |
| 2,750,564 | Strandberg | June 12, 1956 |
| 2,790,150 | Hanthorn | Apr. 23, 1957 |
| 2,805,334 | Cayzac | Sept. 3, 1957 |

OTHER REFERENCES

Radio Amateur's Handbook (1943), pages 243–44.